(12) United States Patent
Yun et al.

(10) Patent No.: US 10,473,989 B2
(45) Date of Patent: Nov. 12, 2019

(54) THIN FILM TRANSISTOR AND DISPLAY DEVICE INCLUDING THE SAME

(71) Applicant: Samsung Display Co., Ltd., Yongin-si, Gyeonggi-Do (KR)

(72) Inventors: Huigyeong Yun, Asan-si (KR);
Daecheol Kim, Hwaseong-si (KR);
Konhaeng Lee, Anyang-si (KR);
Hwarang Lee, Gunpo-si (KR);
Kookhyun Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 976 days.

(21) Appl. No.: 14/866,242

(22) Filed: Sep. 25, 2015

(65) Prior Publication Data

US 2016/0218207 A1   Jul. 28, 2016

(30) Foreign Application Priority Data

Jan. 22, 2015   (KR) .................. 10-2015-0010694

(51) Int. Cl.
*G02F 1/1343*   (2006.01)

(52) U.S. Cl.
CPC ................. *G02F 1/13439* (2013.01)

(58) Field of Classification Search
CPC .................................................. G02F 1/13439
See application file for complete search history.

(56) References Cited

U.S. PATENT DOCUMENTS

| 8,513,071 | B2 | 8/2013 | Kim |
| 8,884,303 | B2 | 11/2014 | Kim |
| 9,076,691 | B2 | 7/2015 | Choi et al. |
| 9,116,297 | B2 | 8/2015 | Wu |
| 2002/0063841 | A1* | 5/2002 | Hirakata ............ G02F 1/1333 349/158 |
| 2004/0099865 | A1* | 5/2004 | Tak .................... H01L 27/124 257/72 |

(Continued)

FOREIGN PATENT DOCUMENTS

| KR | 10-2011-0060567 A | 6/2011 |
| KR | 10-2013-0015736 A | 2/2013 |
| KR | 10-2014-0085771 A | 7/2014 |

*Primary Examiner* — Michael H Caley
*Assistant Examiner* — Agnes Dobrowolski
(74) *Attorney, Agent, or Firm* — H.C. Park & Associates, PLC

(57) ABSTRACT

A thin film transistor (TFT) and a display device including the same capable of displaying an image having a uniform luminance are provided, the TFT including a gate electrode; a gate insulating layer disposed on the gate electrode; a semiconductor layer disposed on the gate insulating layer; a source electrode and a drain electrode disposed on the semiconductor layer while being spaced apart from one another; and a protective layer disposed on the source electrode and the drain electrode and having a contact hole through which a portion of the drain electrode is exposed, wherein the drain electrode includes a first drain electrode overlapping a portion of the gate electrode, a second drain electrode extending from the first drain electrode and having a portion exposed through the contact hole, and a third drain electrode branched from the first drain electrode to be spaced apart from the second drain electrode.

18 Claims, 9 Drawing Sheets

(56) References Cited

U.S. PATENT DOCUMENTS

| | | | |
|---|---|---|---|
| 2010/0157186 A1* | 6/2010 | Kim | G02F 1/134336 349/39 |
| 2012/0326950 A1* | 12/2012 | Park | G09G 3/3607 345/55 |
| 2013/0009218 A1* | 1/2013 | Chen | H01L 29/7816 257/288 |

* cited by examiner

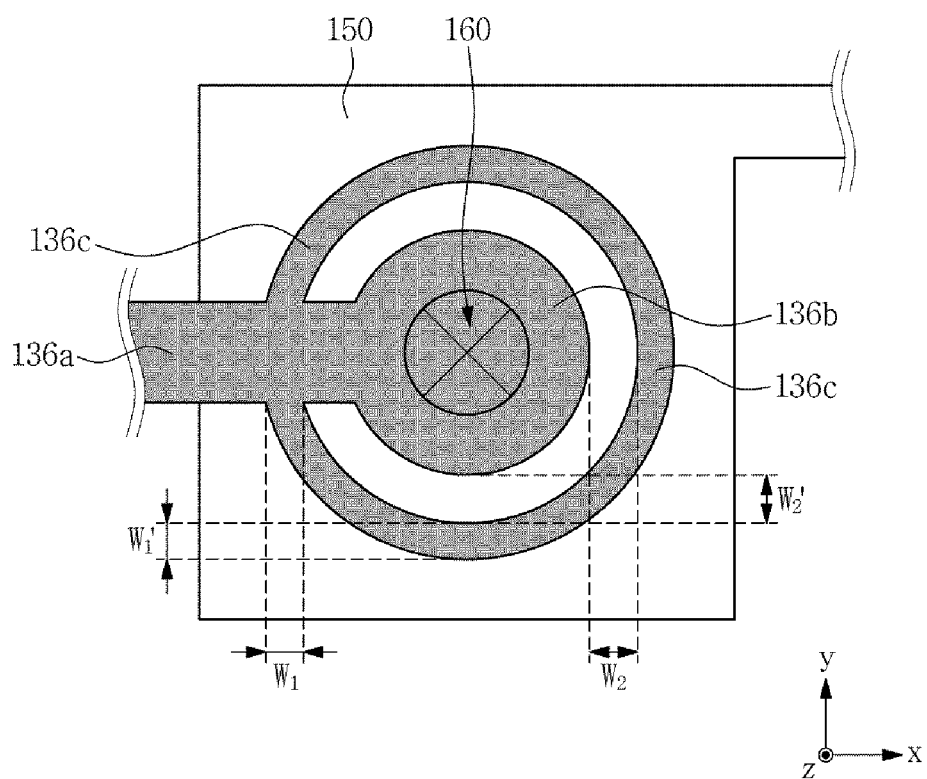

THIN FILM TRANSISTOR AND DISPLAY DEVICE INCLUDING THE SAME

CLAIM OF PRIORITY

This application claims the priority to and all the benefits accruing under 35 U.S.C. § 119 of Korean Patent Application No. 10-2015-0010694, filed on Jan. 22, 2015 with the Korean Intellectual Property Office (KIPO), the disclosure of which is incorporated herein in its entirety by reference.

BACKGROUND OF THE INVENTION

Field of Disclosure

Aspects of embodiments of the present invention relate to a thin film transistor (TFT) and a display device including the same, and more particularly, to a TFT and a display device including the same capable of displaying an image having a uniform luminance.

Description of the Related Art

A liquid crystal display (LCD) device is a type of flat panel display (FPD) device which has found wide recent acceptance. Such an LCD device includes two substrates having electrodes formed thereon and a liquid crystal layer interposed therebetween. Upon voltages being applied to the electrodes, liquid crystal molecules of the liquid crystal layer are re-arranged, such that the amount of transmitted light is adjusted in the display device.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

Aspects of embodiments of the present invention are directed to a thin film transistor (TFT) and a display device including the same capable of displaying an image having a uniform luminance.

According to an exemplary embodiment of the present invention, a TFT includes a gate electrode; a gate insulating layer disposed on the gate electrode; a semiconductor layer disposed on the gate insulating layer; a source electrode and a drain electrode disposed on the semiconductor layer while being spaced apart from one another; and a protective layer disposed on the source electrode and the drain electrode and having a contact hole through which a portion of the drain electrode is exposed, wherein the drain electrode includes a first drain electrode overlapping a portion of the gate electrode, a second drain electrode extending from the first drain electrode and having a portion exposed through the contact hole, and a third drain electrode branched from the first drain electrode to be spaced apart from the second drain electrode.

The second drain electrode may have a circular shape or a polygonal shape.

The third drain electrode may surround an outer circumference of the second drain electrode.

The third drain electrode may have a circular ring shape or a polygonal ring shape.

The third drain electrode may have a width in a range of about 1.5 micrometers (μm) to about 3.0 μm.

The third drain electrode may be disposed to be spaced apart from the outer circumference of the second drain electrode by an interval in a range of about 3.0 μm to about 6.0 μm.

The third drain electrode may be disposed more adjacently to the gate electrode than the second drain electrode is to the gate electrode.

The TFT may further include an ohmic contact layer disposed between the semiconductor layer and the source electrode and between the semiconductor layer and the drain electrode.

According to an exemplary embodiment of the present invention, a display device includes a first substrate; a gate line disposed on the first substrate; a data line disposed to intersect the gate line; a TFT connected to the gate line and the data line; and a pixel electrode connected to the TFT, wherein the TFT includes a gate electrode branched from the gate line, a source electrode branched from the data line, and a drain electrode connected to the pixel electrode, and the drain electrode includes a first drain electrode overlapping a portion of the gate electrode, a second drain electrode extending from the first drain electrode and connected to the pixel electrode, and a third drain electrode branched from the first drain electrode to be spaced apart from the second drain electrode.

The second drain electrode may have a circular shape or a polygonal shape.

The third drain electrode may be disposed to surround an outer circumference of the second drain electrode.

The third drain electrode may have a circular ring shape or a polygonal ring shape.

The third drain electrode may have a width in a range of about 1.5 μm to about 3.0 μm.

The third drain electrode may be disposed to be spaced apart from the outer circumference of the second drain electrode by an interval in a range of about 3.0 μm to about 6.0 μm.

The third drain electrode may be disposed more adjacently to the gate electrode than the second drain electrode is to the gate electrode.

The pixel electrode may include a horizontal stem electrode, a vertical stem electrode, and a plurality of branch electrodes extending from the horizontal stem electrode and the vertical stem electrode.

The branch electrode may include a first branch electrode extending from the horizontal stem electrode and the vertical stem electrode in an upper left direction, a second branch electrode extending from the horizontal stem electrode and the vertical stem electrode in an upper right direction, a third branch electrode extending from the horizontal stem electrode and the vertical stem electrode in a lower left direction, and a fourth branch electrode extending from the horizontal stem electrode and the vertical stem electrode in a lower right direction.

The display device may further include a color filter disposed between the TFT and the pixel electrode.

The display device may further include a second substrate disposed opposite to the first substrate; a common electrode disposed on the second substrate; and a liquid crystal layer interposed between the first and second substrates.

The display device may further include an alignment layer disposed on the first or second substrate, wherein the alignment layer or the liquid crystal layer includes a polymer material having an orientation.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein

FIG. 9 is an enlarged view illustrating portion "C" of FIG. 8.

DETAILED DESCRIPTION OF THE INVENTION

Figure 1:
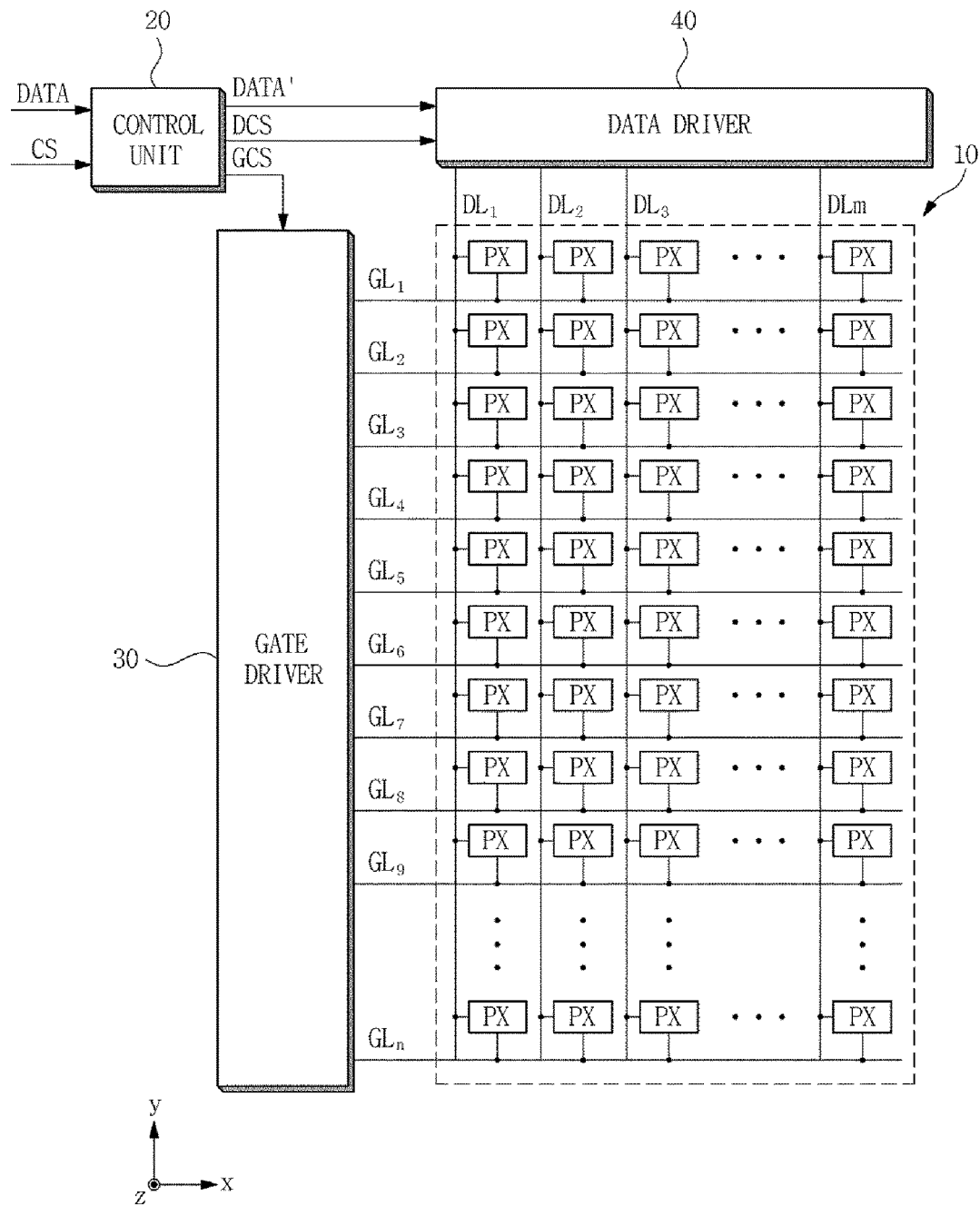
FIG. 1 is a block diagram illustrating a display device according to an exemplary embodiment of the present invention.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

All terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the invention. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

FIG. 1 is a block diagram illustrating a display device according to an exemplary embodiment of the present invention.

Referring to FIG. 1, the display device according to the exemplary embodiment may include a display panel 10 having a plurality of pixels PX, a control unit 20 processing an image signal DATA and a control signal CS, which are externally received, to output the processed signals as various signals, a gate driver 30 supplying gate signals to gate lines GL1 through GLn, respectively, and a data driver 40 supplying data voltages to data lines DL1 through DLm, respectively.

The display panel 10 may include the plurality of gate lines GL1 through GLn transmitting the gate signals in a row direction, the plurality of data lines DL1 through DLm transmitting the data voltages in a column direction, and the plurality of pixels PX arranged in a matrix form in a region in which the gate lines and the data lines intersect one another.

The display panel 10 may include a first substrate, a second substrate disposed opposite to the first substrate, and a liquid crystal layer interposed between the first and second substrates.

The control unit 20 may output a corrected image signal DATA' to the data driver 40 based on the externally received image signal DATA. In addition, the control unit 20 may supply a gate control signal GCS to the gate driver 30 and may supply a data control signal DCS to the data driver 40 based on the externally received control signal CS. For example, the control signal CS may be a timing signal such as a vertical synchronization signal Vsync, a horizontal synchronization signal Hsync, a clock signal CLK, and a data enable signal DE, and the image signal DATA may be a digital signal representing a gray scale of light output from the pixel PX.

The gate driver 30 may receive the gate control signal GCS from the control unit 20 supplied thereto to generate the gate signal, and may supply the gate signals to the pixels PX connected to the plurality of gate lines GL1 through GLn, respectively. As the gate signals are sequentially applied to the pixels PX, the data voltages may be sequentially supplied to the pixels PX.

The data driver 40 may receive the data control signal DCS and the corrected image signal DATA' from the control unit 20, and may supply a data voltage corresponding to the corrected image signal DATA' to the pixels PX respectively connected to the plurality of data lines DL1 through DLm in response to the data control signal DCS.

Figure 2:
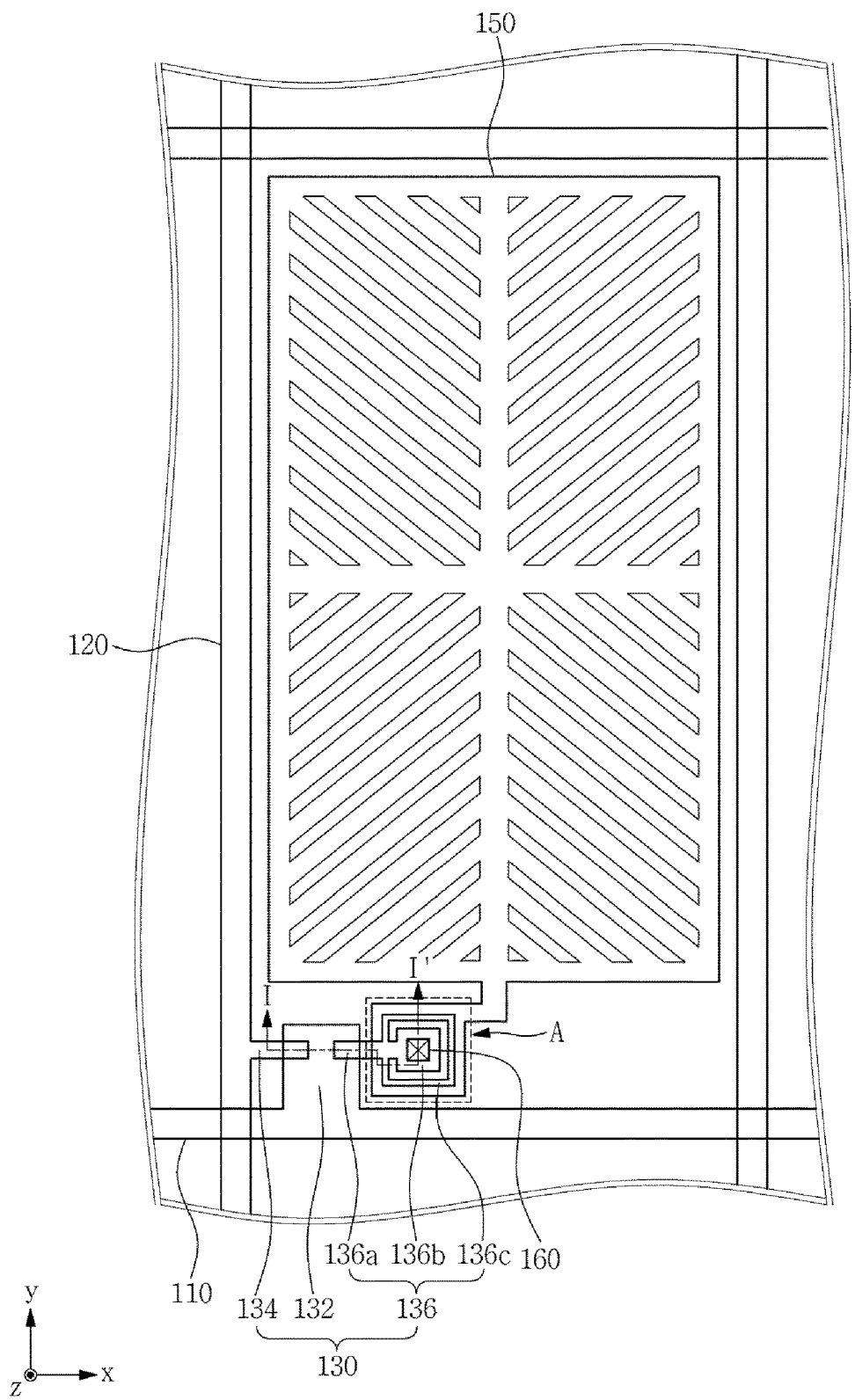
FIG. 2 is a plan view illustrating a display device according to an exemplary embodiment of the present invention.
Figure 3:
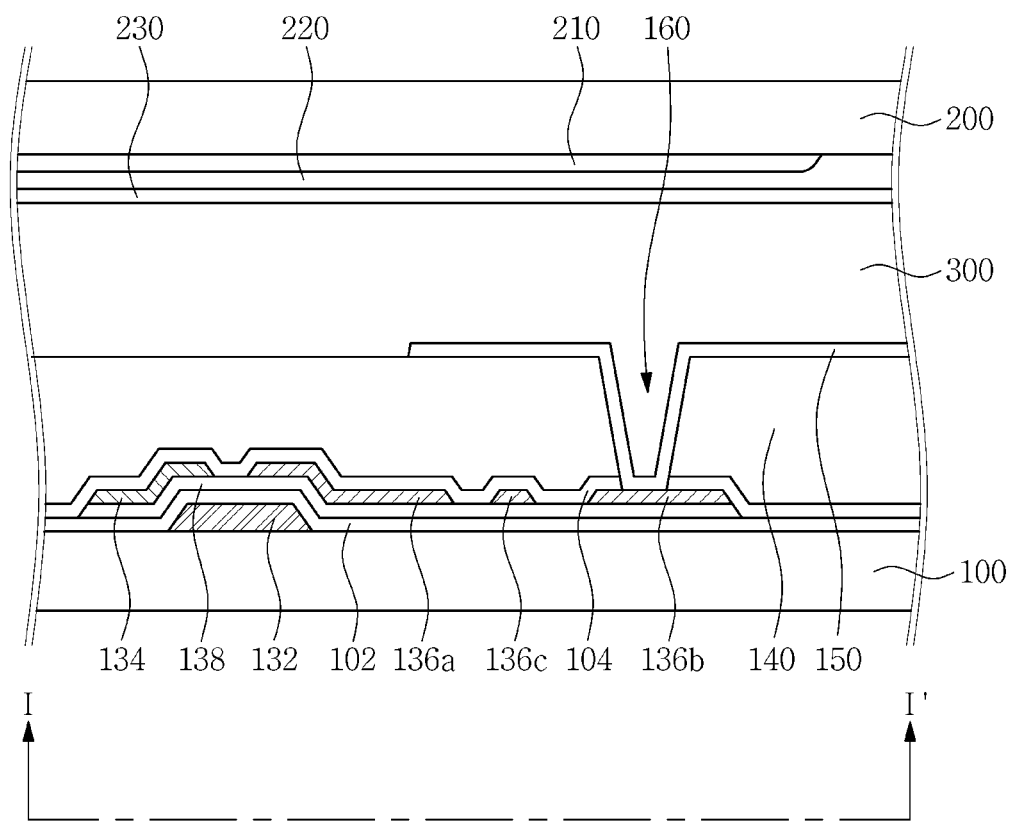
FIG. 3 is a cross-sectional view taken along line I-I' of FIG. 2.

FIG. 2 is a plan view illustrating a display device according to an exemplary embodiment of the present invention; and FIG. 3 is a cross-sectional view taken along line I-I' of FIG. 2.

A first substrate 100 may be formed of transparent glass, plastic, or the like, and may have a planar shape or a curved shape having a predetermined radius of curvature.

A gate line 110 may be disposed on the first substrate 100 in a horizontal direction. However, the disposition of the gate line 110 is not limited thereto, and the gate line 110 may be disposed on the first substrate 100 in a vertical direction.

The gate line 110 may be formed of an aluminum (Al) based metal such as Al or an Al alloy, a silver (Ag) based metal such as Ag or an Ag alloy, a copper (Cu) based metal such as Cu or a Cu alloy, a molybdenum (Mo) based metal such as Mo or a Mo alloy, chromium (Cr), tantalum (Ta), and titanium (Ti); however, the material forming the gate line 110 is not limited thereto, and the gate line 110 may have a multilayer structure including at least two conductive layers having different physical properties.

A data line 120 may be disposed in a vertical direction intersect the gate line 110, and may be insulated from the gate line 110 by a gate insulating layer 102. However, the disposition of the data line 120 is not limited thereto, and the data line 120 may be disposed in a horizontal direction.

The data line 120 may be formed of a refractory metal such as Mo, Cr, Ta, and Ti or an alloy thereof; however, the material forming the data line 120 is not limited thereto, and the data line 120 may have a multilayer structure including a refractory metal layer and a low resistance conductive layer.

A thin film transistor (TFT) 130 may include a gate electrode 132 branched from the gate line 110, a source electrode 134 branched from the data line 120, and a drain electrode 136 connected to a pixel electrode 150.

The gate electrode 132 may be insulated from the source electrode 134 and the drain electrode 136 by the gate insulating layer 102. A semiconductor layer 138 may be disposed between the gate insulating layer 102 and the source electrode 134 and between the gate insulating layer 102 and the drain electrode 136.

The gate electrode 132 may be formed of a conductive material, and may have a monolayer or multilayer structure formed using one of Mo, Al, Cr, Au, Ti, Ni, neodymium (Nd), and Cu, or an alloy thereof. However, the material forming the gate electrode 132 is not limited thereto, and the gate electrode 132 may be formed of various conductive materials.

The gate insulating layer 102 may be disposed on the first substrate 100 to cover the gate electrode 132, and may serve to prevent infiltration of moisture or impure elements through the first substrate 100. The gate insulating layer 102 may be formed of an insulating material, and may have a monolayer or multilayer structure formed of silicon nitride (SiNx) or silicon oxide (SiO2). However, the material forming the gate insulating layer 102 is not limited thereto, and the gate insulating layer 102 may be formed of various insulating materials.

The semiconductor layer 138 may be formed of an oxide semiconductor. The oxide semiconductor may be a metal oxide semiconductor (MOS), and may include one or more of metals such as zinc (Zn), indium (In), gallium (Ga), tin (Sn), and titanium (Ti), and an oxide thereof. For example, the oxide semiconductor may include at least one of zinc oxide (ZnO), indium-gallium-zinc oxide (IGZO), and indium-zinc-tin oxide (IZTO). However, the material forming the semiconductor layer 138 is not limited thereto, and the semiconductor layer 138 may be formed of various materials.

The source electrode 134 may be disposed on the semiconductor layer 138. The source electrode 134 may be formed of a conductive material, and may have a monolayer or multilayer structure formed using one of Mo, Al, Cr, Au, Ti, Ni, Nd, and Cu, or an alloy thereof. However, the material forming the source electrode 134 is not limited thereto, and the source electrode 134 may be formed of various conductive materials.

The drain electrode 136 may be disposed on the semiconductor layer 138 while being spaced apart from the source electrode 134. The drain electrode 136 may be formed of a conductive material, and may have a monolayer or multilayer structure formed using one of Mo, Al, Cr, Au, Ti, Ni, Nd, and Cu, or an alloy thereof. However, the material forming the drain electrode 136 is not limited thereto, and the drain electrode 136 may be formed of various conductive materials.

The drain electrode 136 may include a first drain electrode overlapping a portion of the gate electrode 132, a second drain electrode 136b extending from the first drain electrode 136a and having a portion exposed through a contact hole 160, and a third drain electrode 136c branched from the first drain electrode 136a to be spaced apart from the second drain electrode 136b.

Figure 4:
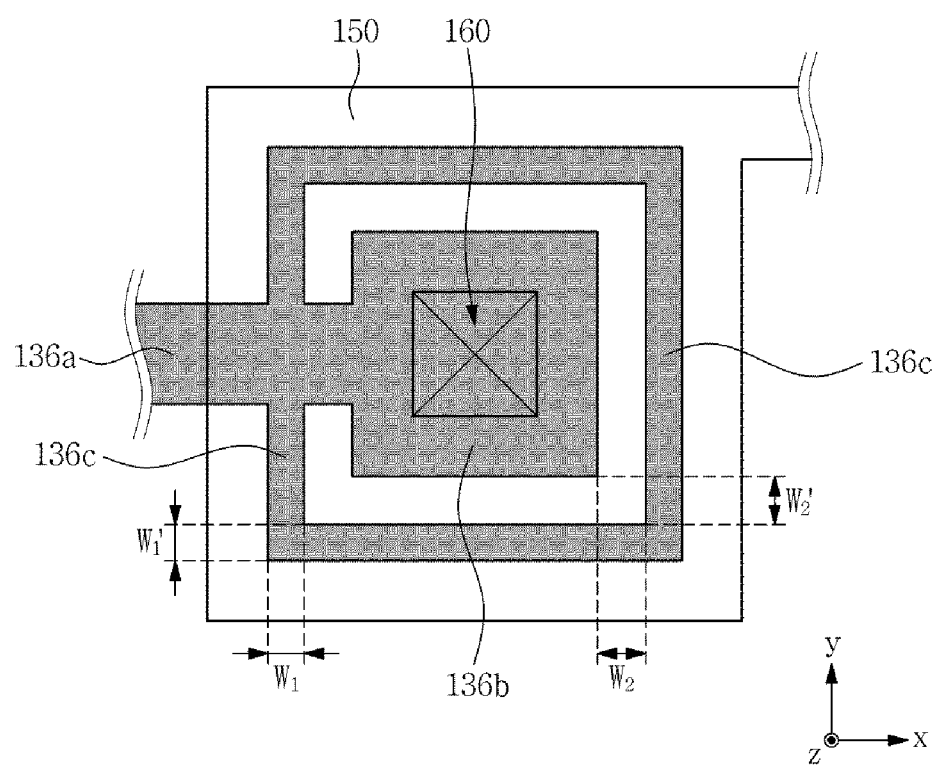
FIG. 4 is an enlarged view illustrating portion "A" of FIG. 2.

A description pertaining to the second drain electrode 136b and the third drain electrode 136c will be provided in further detail with reference to FIG. 4.

Although not illustrated, an ohmic contact layer may further be disposed between the source electrode 134 and the semiconductor layer 138 and between the drain electrode 136 and the semiconductor layer 138. The ohmic contact layer (not illustrated) may be formed of a material such as silicide or amorphous silicon doped with n-type impurities at high concentration.

A protective layer 104 may be disposed on the source electrode 134 and the drain electrode 136, and may have the contact hole 160 through which a portion of the drain electrode 136 is exposed. The protective layer 104 may be formed of an inorganic insulating material or an organic insulating material such as SiNx or SiOx.

A color filter 140 may be disposed on the protective layer 104. The color filter 140 may display one of basic colors, such as the three primary colors of red, green, and blue. However, the color displayed by the color filter 140 is not limited thereto, and the color filter 140 may display one of cyan, magenta, yellow, and white. In addition, the disposition of the color filter 140 and the protective layer 104 is not limited thereto, and the color filter 140 may be disposed on a second substrate 200, and an organic layer formed of an organic material may be disposed on the protective layer 104.

Although not illustrated, a capping layer may be disposed on the color filter 140. The capping layer (not illustrated) may serve to prevent contaminants generated from the color filter 140 from flowing into a liquid crystal layer 300. The capping layer (not illustrated) may be formed of an inorganic material or organic material such as SiNx, SiO2, or silicon oxycarbide (SiOC).

The pixel electrode 150 may be disposed on the color filter 140, and may be formed of a transparent conductive material. The pixel electrode 150 may be electrically connected to the drain electrode 136 through the contact hole 160, such that a data voltage may be applied to the pixel electrode 150.

Figure 5:
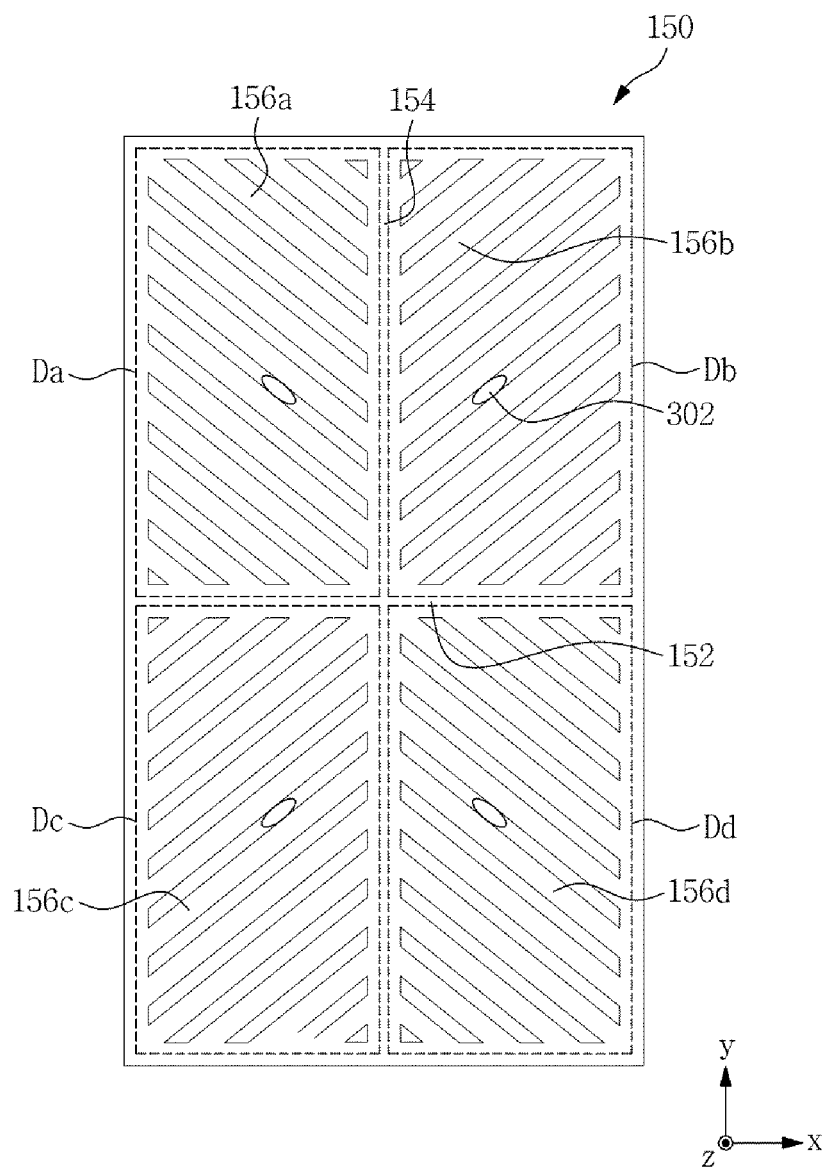
FIG. 5 is a view illustrating a pixel electrode of FIG. 2.

A description pertaining to the pixel electrode 150 will be provided in further detail with reference to FIG. 5.

Although not illustrated, an alignment layer may further be disposed on the pixel electrode 150. The alignment layer may be a homeotropic alignment layer or a photo-aligned alignment layer. The photo-aligned alignment layer may include a polymer material having an orientation formed by irradiating ultraviolet (UV) light polarized in a predetermined direction.

The second substrate 200 may be disposed opposite to the first substrate 100, and may be formed of transparent glass, plastic, or the like. The second substrate 200 may have a planar shape or a curved shape having a radius of curvature less than that of the first substrate 100.

A light shielding portion 210 may be disposed on the second substrate 200 to cover the gate line 110, the data line 120, and the TFT 130. However, the disposition of the light shielding portion 210 is not limited thereto, and the light shielding portion 210 may be disposed on the first substrate 100.

The light shielding portion 210 may serve to prevent leakage of light generated in the gate line 110, the data line 120, and the TFT 130. The light shielding portion 210 may be formed of a photosensitive organic material added with a black pigment, and the like.

A planarization layer 220 may be disposed on the light shielding portion 210, and may serve to planarize the light shielding portion 210. The planarization layer 220 may be formed of an organic material, and the like.

A common electrode 230 may be disposed on the planarization layer 220, and may be formed of a transparent conductive material.

Although not illustrated, an alignment layer may further be disposed on the common electrode 230. The alignment layer may be a homeotropic alignment layer or a photo-aligned alignment layer. The photo-aligned alignment layer may include a polymer material having an orientation formed by irradiating UV light polarized in a predetermined direction.

The liquid crystal layer 300 may be interposed between the first and second substrates 100 and 200. The liquid crystal layer 300 may include a polymer material having an orientation formed by irradiating UV light polarized in a predetermined direction.

FIG. 4 is an enlarged view illustrating portion "A" of FIG. 2.

The second drain electrode 136*b* may extend from the first drain electrode 136*a*, and may have a quadrangular shape. However, the shape of the second drain electrode 136*b* is not limited thereto, and may be modified in various manners based on the disposition of the TFT 130 and the pixel electrode 150.

A contact hole 160 may be formed on the second drain electrode 136*b*, and a portion of the second drain electrode 136*b* may be exposed through the contact hole 160.

The third drain electrode 136*c* may be branched from the first drain electrode 136*a* to be disposed to surround an outer circumference of the second drain electrode 136*b*. For example, the display device according to the exemplary embodiment may be provided in a manner in which the second drain electrode 136*b* and the third drain electrode 136*c* are disposed to have a double-wall structure around the contact hole 160.

The third drain electrode 136*c* may have a quadrangular ring shape. However, the shape of the third drain electrode 136*c* is not limited thereto, and may be modified in various manners based on the shape of the second drain electrode 136*b*.

The third drain electrode 136*c* may have widths W1 and W1' in a range of about 1.5 micrometers (μm) to about 3.0 μm. In addition, the third drain electrode 136*c* may be disposed to be spaced apart from the outer circumference of the second drain electrode 136*b* by intervals W2 and W2' in a range of about 3.0 μm to about 6.0 μm. However, the width of the third drain electrode 136*c* and the interval between the third drain electrode 136*c* and the second drain electrode 136*b* may slightly differ from the aforementioned ranges due to process errors, and the like.

In a case in which the color filter 140 or the organic layer (not illustrated) is disposed on the first substrate 100 as in the display device according to the exemplary embodiment, the color filter 140 may collapse from the contact hole 160 toward the gate electrode 132 due to various process errors. Upon the collapse of the color filter 140, a variation in capacitance formed between the gate electrode 132 and the pixel electrode 150 disposed on the color filter 140 may occur, such that displaying an image having a uniform luminance may be difficult.

In the display device according to the exemplary embodiment, the second drain electrode 136*b* and the third drain electrode 136*c* may be disposed around the contact hole 160 to have the double-wall structure. In particular, the third drain electrode 136*c* may be disposed more adjacently to the gate electrode 132 than the second drain electrode 136*b* is to the gate electrode 132. Accordingly, the display device according to the exemplary embodiment may display an image having a uniform luminance through capacitance having a predetermined level formed between the gate electrode 132 and the third drain electrode 136*c* despite the collapse of the color filter 140.

FIG. 5 is a view illustrating a pixel electrode of FIG. 2.

The pixel electrode 150 may include a horizontal stem electrode 152, a vertical stem electrode 154, and a plurality of branch electrodes 156*a*, 156*b*, 156*c*, and 156*d* branched from the horizontal stem electrode 152 and the vertical stem electrode 154 to extend therefrom.

The horizontal stem electrode 152 and the vertical stem electrode 154 may have a linear shape, and may be combined with one another to form a cross-shaped stem electrode. However, the shape of the horizontal stem electrode 152 and the vertical stem electrode 154 is not limited thereto, and the horizontal stem electrode 152 and the vertical stem electrode 154 may be provided in a manner in which a width of the horizontal stem electrode 152 and the vertical stem electrode 154 is increased from a side of the pixel electrode 150 toward a center of the pixel electrode 150.

The first branch electrode 156*a* may be branched from the horizontal stem electrode 152 and the vertical stem electrode 154 to extend in an upper left direction, and the second branch electrode 156*b* may be branched from the horizontal stem electrode 152 and the vertical stem electrode 154 to extend in an upper right direction. The third branch electrode 156*c* may be branched from the horizontal stem electrode 152 and the vertical stem electrode 154 to extend in a lower left direction, and the fourth branch electrode 156d may be branched from the horizontal stem electrode 152 and the vertical stem electrode 154 to extend in a lower right direction.

Sides of the first through fourth branch electrodes 156a, 156b, 156c, and 156d may distort an electric field to form a horizontal component of the electric field determining an inclination direction of a liquid crystal molecule 302. The horizontal components of the electric field may be formed on the sides of the first through fourth branch electrodes 156a, 156b, 156c, and 156d to be substantially parallel with respect to the sides of the first through fourth branch electrodes 156a, 156b, 156c, and 156d, respectively. Accordingly, the liquid crystal molecules 302 may be arranged in four different directions in sub-regions Da through Dd of the pixel electrode 150, respectively.

Figure 6:
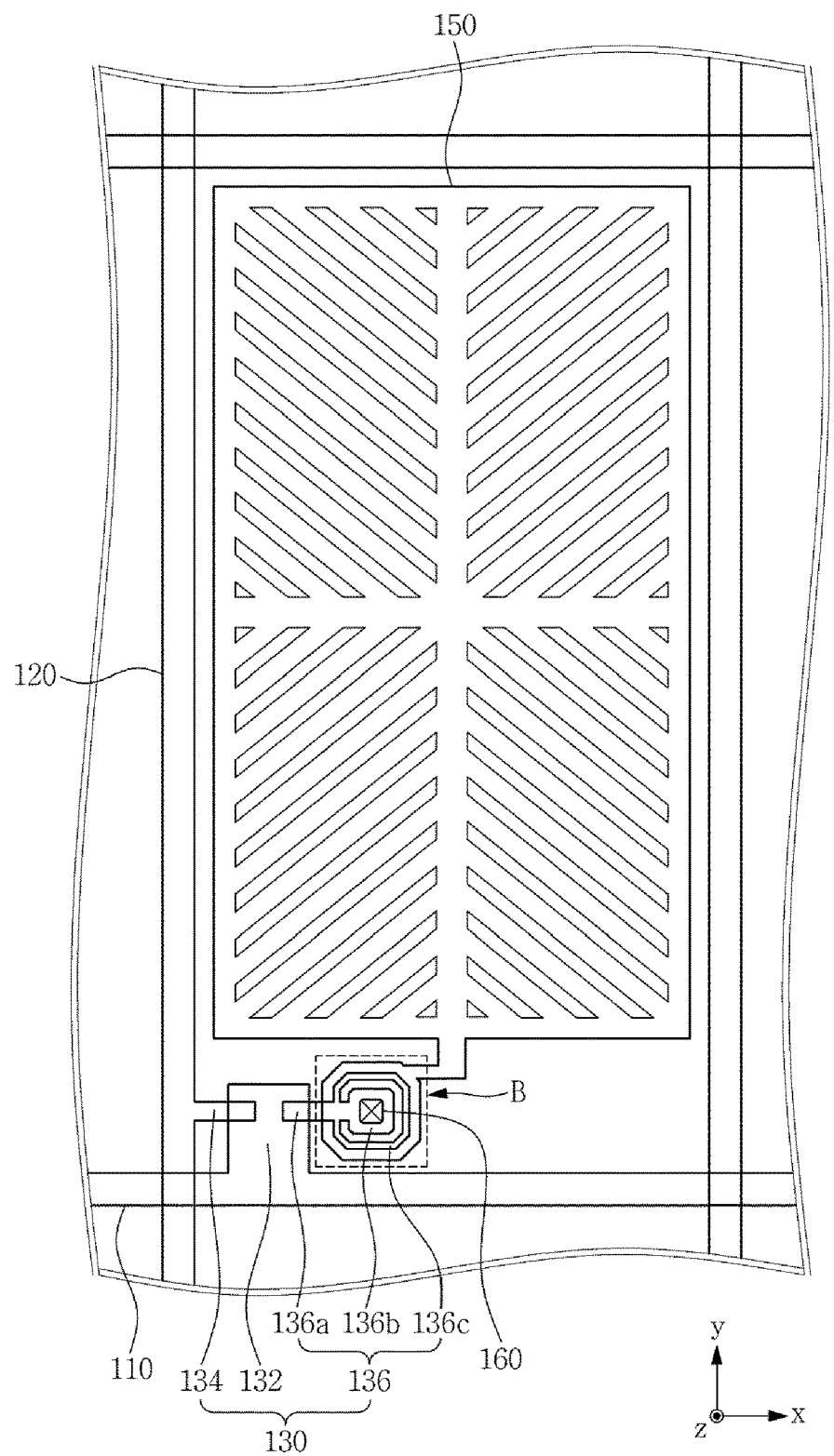
FIG. 6 is a plan view illustrating a display device according to another exemplary embodiment of the present invention.
Figure 7:
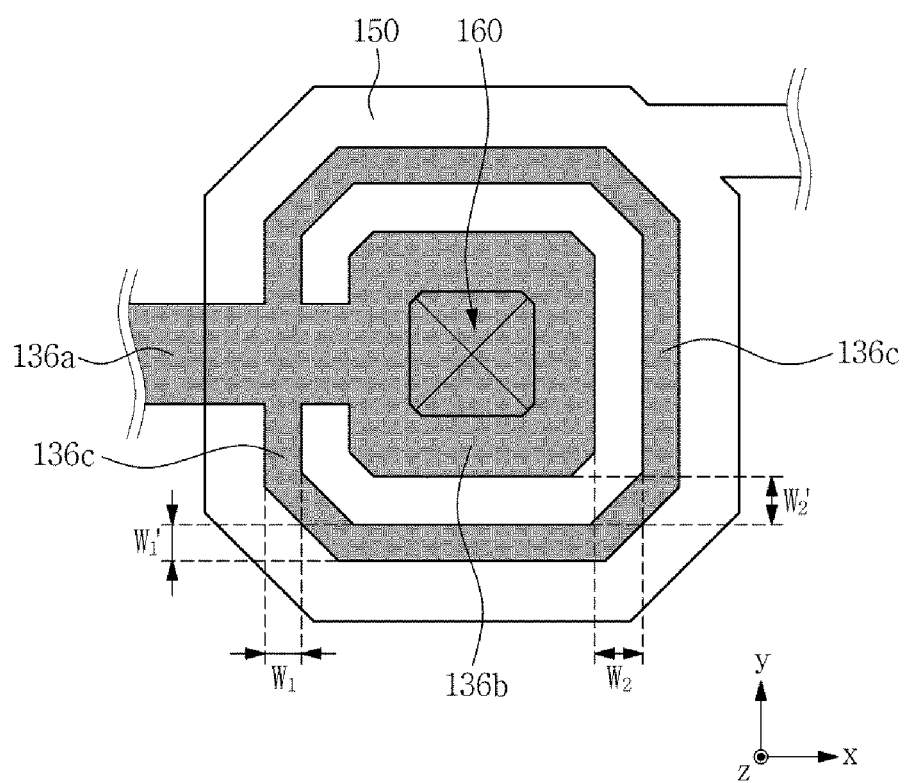
FIG. 7 is an enlarged view illustrating portion "B" of FIG. 6.

FIG. 6 is a plan view illustrating a display device according to another exemplary embodiment of the present invention; and FIG. 7 is an enlarged view illustrating portion "B" of FIG. 6.

Since the display device of FIGS. 6 and 7 has the same configuration as that of the display device of FIGS. 2 and 4, aside from a shape of a second drain electrode 136b and a third drain electrode 136c, a repeated description thereof will be omitted for conciseness.

The second drain electrode 136b may extend from the first drain electrode 136a, and may have an octagonal shape. A contact hole 160 may be formed on the second drain electrode 136b, and a portion of the second drain electrode 136b is exposed through the contact hole 160.

The third drain electrode 136c may be branched from the first drain electrode 136a to surround an outer circumference of the second drain electrode 136b. The third drain electrode 136c may have an octagonal ring shape.

The third drain electrode 136c may have widths W1 and W1' in a range of about 1.5 µm to about 3.0 µm. In addition, the third drain electrode 136c may be disposed to be spaced apart from the outer circumference of the second drain electrode 136b by intervals W2 and W2' in a range of about 3.0 µm to about 6.0 µm. However, the width of the third drain electrode 136c and the interval between the third drain electrode 136c and the second drain electrode 136b may slightly differ from the aforementioned ranges due to process errors, and the like.

Figure 8:
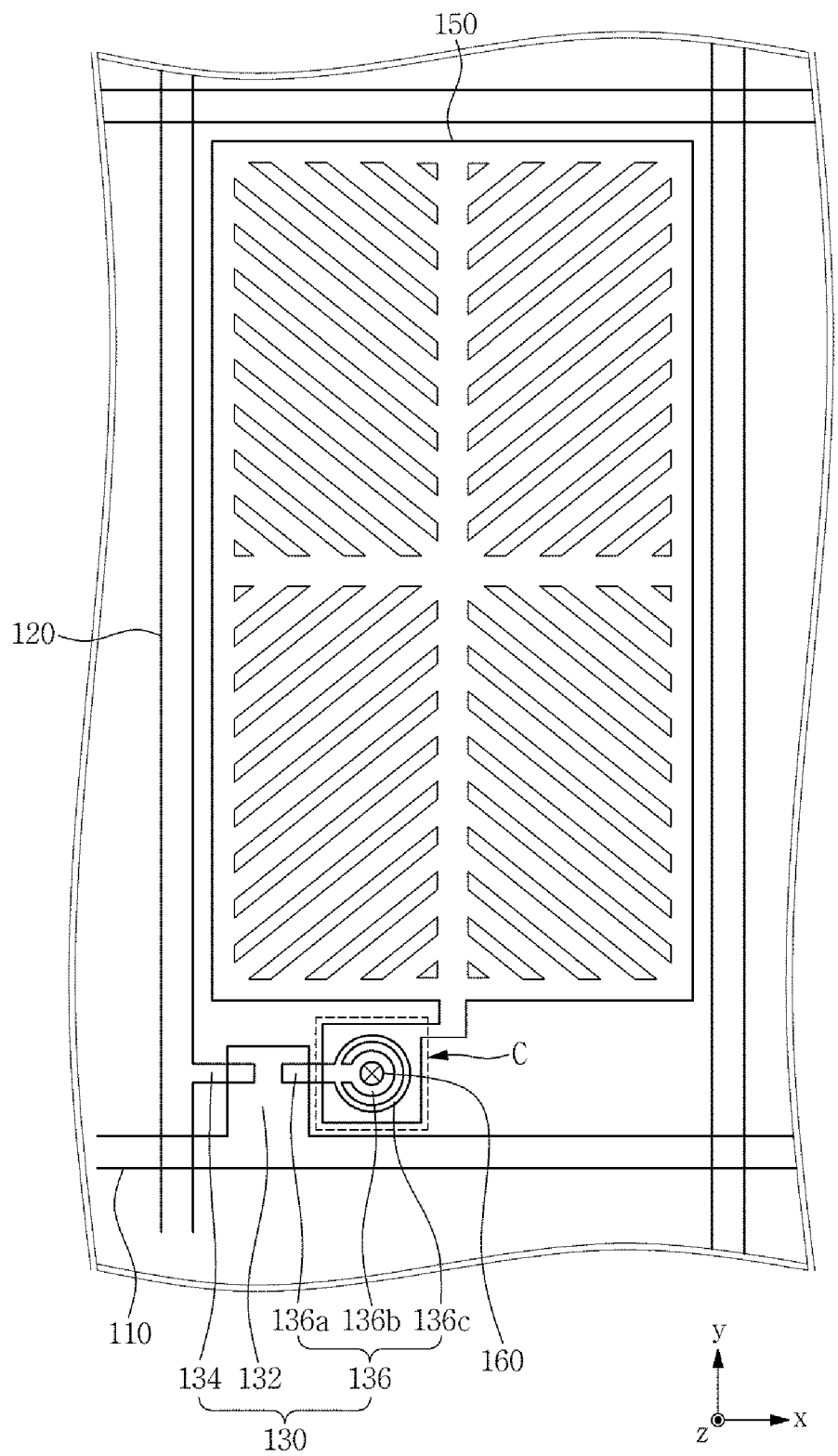
FIG. 8 is a plan view illustrating a display device according to still another exemplary embodiment of the present invention.

FIG. 8 is a plan view illustrating a display device according to still another exemplary embodiment of the present invention; and FIG. 9 is an enlarged view illustrating portion "C" of FIG. 8.

Since the display device of FIGS. 8 and 9 has the same configuration as that of the display device of FIGS. 2 and 4, aside from a shape of a second drain electrode 136b and a third drain electrode 136c, a repeated description thereof will be omitted for conciseness.

The second drain electrode 136b may extend from the first drain electrode 136a, and may have a circular shape. A contact hole 160 may be formed on the second drain electrode 136b, and a portion of the second drain electrode 136b may be exposed through the contact hole 160.

The third drain electrode 136c may be branched from the first drain electrode 136a to surround an outer circumference of the second drain electrode 136b. The third drain electrode 136c may have a circular ring shape.

The third drain electrode 136c may have widths W1 and W1' in a range of about 1.5 µm to about 3.0 µm. In addition, the third drain electrode 136c may be disposed to be spaced apart from the outer circumference of the second drain electrode 136b by intervals W2 and W2' in a range of about 3.0 µm to about 6.0 µm. However, the width of the third drain electrode 136c and the interval between the third drain electrode 136c and the second drain electrode 136b may slightly differ from the aforementioned ranges due to process errors, and the like.

As set forth above, according to exemplary embodiments, the TFT and the display device including the same may display an image having a uniform luminance.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A thin film transistor (TFT), comprising:
   a gate electrode;
   a gate insulating layer disposed on the gate electrode;
   a semiconductor layer disposed on the gate insulating layer;
   a source electrode and a drain electrode disposed on the semiconductor layer while being spaced apart from one another; and
   a protective layer disposed on the source electrode and the drain electrode and having a contact hole through which a portion of the drain electrode is exposed,
   wherein the drain electrode comprises:
      a first portion of the drain electrode overlapping a portion of the gate electrode,
      a second portion of the drain electrode extending from the first portion of the drain electrode, comprising an outer circumference in plan view, and comprising a portion exposed through the contact hole, and
      a third portion of the drain electrode branched from the first portion of the drain electrode and spaced apart from the outer circumference of the second portion of the drain electrode,
   wherein the first portion of the drain electrode and the third portion of drain electrode form a closed ring shape in a plan view that surrounds the second portion of the drain electrode.

2. The TFT of claim 1, wherein the second portion of the drain electrode has one of a circular shape and a polygonal shape.

3. The TFT of claim 1, wherein the third portion of the drain electrode has one of a circular ring shape and a polygonal ring shape.

4. The TFT of claim 1, wherein the third portion of the drain electrode has a width in a range of about 1.5 micrometers (µm) to about 3.0 µm.

5. The TFT of claim 1, wherein the third portion of the drain electrode is disposed to be spaced apart from the outer circumference of the second portion of the drain electrode by an interval in a range of about 3.0 µm to about 6.0 µm.

6. The TFT of claim 1, wherein the third portion of the drain electrode is disposed more adjacently to the gate electrode than the second portion of the drain electrode is to the gate electrode.

7. The TFT of claim 1, further comprising an ohmic contact layer disposed between the semiconductor layer and the source electrode and between the semiconductor layer and the drain electrode.

8. A display device comprising:
a first substrate;
a gate line disposed on the first substrate;
a data line disposed to intersect the gate line;
a thin film transistor (TFT) connected to the gate line and the data line; and
a pixel electrode connected to the TFT,
wherein the TFT comprises:
  a gate electrode branched from the gate line,
  a source electrode branched from the data line, and
  a drain electrode connected to the pixel electrode, and the drain electrode comprises:
    a first portion of the drain electrode overlapping a portion of the gate electrode,
    a second portion of the drain electrode extending from the first portion of the drain electrode, comprising an outer circumference in plan view, and connected to the pixel electrode, and
    a third portion of the drain electrode branched from the first portion of the drain electrode and spaced apart from the outer circumference of the second portion of the drain electrode,
  wherein the first portion of the drain electrode and the third portion of the drain electrode from a closed ring shape in a plan view that surrounds the second portion of the drain electrode.

9. The display device of claim 8, wherein the second portion of the drain electrode has one of a circular shape and a polygonal shape.

10. The display device of claim 8, wherein the third portion of the drain electrode has one of a circular ring shape and a polygonal ring shape.

11. The display device of claim 8, wherein the third portion of the drain electrode has a width in a range of about 1.5 micrometers (μm) to about 3.0 μm.

12. The display device of claim 8, wherein the third portion of the drain electrode is disposed to be spaced apart from the outer circumference of the second portion of the drain electrode by an interval in a range of about 3.0 μm to about 6.0 μm.

13. The display device of claim 8, wherein the third portion of the drain electrode is disposed more adjacently to the gate electrode than the second portion of the drain electrode is to the gate electrode.

14. The display device of claim 8, wherein the pixel electrode comprises:
  a horizontal stem electrode,
  a vertical stem electrode, and
  a plurality of branch electrodes extending from the horizontal stem electrode and the vertical stem electrode.

15. The display device of claim 14, wherein the branch electrode comprises:
  a first branch electrode extending from the horizontal stem electrode and the vertical stem electrode in an upper left direction,
  a second branch electrode extending from the horizontal stem electrode and the vertical stem electrode in an upper right direction,
  a third branch electrode extending from the horizontal stem electrode and the vertical stem electrode in a lower left direction, and
  a fourth branch electrode extending from the horizontal stem electrode and the vertical stem electrode in a lower right direction.

16. The display device of claim 8, further comprising a color filter disposed between the TFT and the pixel electrode.

17. The display device of claim 8, further comprising:
  a second substrate disposed opposite to the first substrate;
  a common electrode disposed on the second substrate; and
  a liquid crystal layer interposed between the first and second substrates.

18. The display device of claim 17, further comprising an alignment layer disposed on the first or second substrate,
  wherein one of the alignment layer and the liquid crystal layer includes a polymer material having an orientation.

* * * * *